(12) United States Patent
Jauss et al.

(10) Patent No.: US 12,451,543 B2
(45) Date of Patent: Oct. 21, 2025

(54) FLUID MANAGEMENT MODULE FOR COOLING AN ELECTRIC ENERGY STORE BY MEANS OF IMMERSION COOLING

(71) Applicant: Mahle International GmbH, Stuttgart (DE)

(72) Inventors: Stefan Jauss, Donzdorf (DE); Kai Saupe, Boeblingen (DE); Nic Sautter, Plochingen (DE)

(73) Assignee: Mahle International GmbH (DE)

( * ) Notice: Subject to any disclaimer, the term of this patent is extended or adjusted under 35 U.S.C. 154(b) by 575 days.

(21) Appl. No.: 17/945,911

(22) Filed: Sep. 15, 2022

(65) Prior Publication Data

US 2023/0082424 A1   Mar. 16, 2023

(30) Foreign Application Priority Data

Sep. 16, 2021 (DE) .......................... 102021210265.4

(51) Int. Cl.
*H01M 10/6568* (2014.01)
*H01M 10/613* (2014.01)
*H01M 10/6556* (2014.01)

(52) U.S. Cl.
CPC ..... *H01M 10/6568* (2015.04); *H01M 10/613* (2015.04); *H01M 10/6556* (2015.04)

(58) Field of Classification Search
CPC ............... H01M 10/613; H01M 10/63; H01M 10/6568; H01M 10/6556
See application file for complete search history.

(56) References Cited

U.S. PATENT DOCUMENTS 9,527,403 B2 *   12/2016   Mardall .................. B60L 53/35
2015/0306974 A1   10/2015   Mardall

FOREIGN PATENT DOCUMENTS

| CN | 112886093 A | * | 6/2021 | |
|---|---|---|---|---|
| CN | 118610648 A | * | 9/2024 | |
| DE | 102018202501 A1 | | 8/2019 | |
| DE | 102019130800 A1 | | 5/2021 | |
| DE | 102020105989 A1 | | 9/2021 | |
| WO | WO-2019158466 A1 | * | 8/2019 | .......... H01M 10/625 |

OTHER PUBLICATIONS

Machine translation of WO 2019/158466 (no date) (Year: 0000).*
English abstract for DE-102019130800.
English abstract for DE-102018202501.
English abstract for DE-102020105989.
German Search Report for DE-10 2021 210 265.4, dated Mar. 15, 2022.

* cited by examiner

*Primary Examiner* — Amanda C. Walke
(74) *Attorney, Agent, or Firm* — Fishman Stewart PLLC

(57) ABSTRACT

A fluid management module for cooling an electric energy store by immersion cooling is disclosed. The fluid management module includes a fluid path for a cooling medium comprising an inlet connection and an outlet connection. A heat exchanger and a filter device are arranged in the fluid path. A valve device is arranged in the fluid path between the inlet connection and the outlet connection. A service inlet connection communicates with the fluid path between the valve device and the outlet connection and a service outlet connection communicates with the fluid path between the inlet connection and the heat exchanger, for fluidically connecting the fluid path with a service unit containing a cooling medium reservoir for the cooling medium.

20 Claims, 4 Drawing Sheets

FLUID MANAGEMENT MODULE FOR COOLING AN ELECTRIC ENERGY STORE BY MEANS OF IMMERSION COOLING

CROSS-REFERENCE TO RELATED APPLICATION

This application claims priority to German Application No. DE 10 2021 210 265.4 filed on Sep. 16, 2021, the contents of which are hereby incorporated by reference in its entirety.

TECHNICAL FIELD

The invention relates to a fluid management module for cooling an electric energy store by means of immersion cooling and to a method for operating such a fluid management module. Finally, the invention relates to an arrangement having such a fluid management module.

BACKGROUND

Immersion cooling is increasingly gaining importance in particular when quick-charging electric energy stores of motor vehicles with battery-electric drive. With immersion cooling of an electric energy store, the same is flowed about directly by a liquid cooling medium, typically an electrically insulating and dielectric cooling liquid. For this purpose, a so-called fluid management module can be connected to the energy store so that a fluid circuit is created, in which the cooling medium circulates through the module and through the energy store. In the fluid management module, a filter device can be arranged in order to free the circulating cooling medium of dirt particles. In addition, a heat exchanger can be arranged in the module in order to pass the waste heat of the energy store absorbed by the cooling medium on to another medium. This medium can be for example air, but also another single-phase or multi-phase medium. Finally, a delivery device, in particular a fluid pump, can be arranged in the module in order to drive the cooling medium. Since during the operation of the fluid management module cooling medium can be lost over the course of time because of leakages it is necessary to replenish the same at certain intervals. For this purpose, a so-called service unit formed separately from the fluid management module can be provided in which a cooling medium reservoir with cooling medium is provided.

By connecting the fluid management module to the service unit it is possible to provide the fluid management module with cooling medium for replenishing. However, in connection with the said service unit, the fluid management module can also be utilised for flushing and thus cleaning the fluid paths that are present in the energy store and are flowed through by the cooling medium with cooling medium from the cooling medium reservoir.

It is an object of the present invention to show new ways in the development of fluid management modules for the immersion cooling of electric energy stores.

This object is solved through the subject of the independent patent claim(s). Preferred embodiments are subject of the dependent patent claims.

SUMMARY

Accordingly, the basic idea of the invention is to provide a valve device in a fluid path provided in the fluid management module, which in the fluid management module simplifies both a replenishing operation and also a flushing operation with coolant. By means of the valve device it is ensured that during filling and during the flushing of fluid management module and energy store with cooling medium, the fluid path present in the module and in the energy store is flowed through correctly. In particular it can be prevented by means of such a valve device that the cooling medium during the filling and during the flushing is conducted past the energy store in the manner of a bypass.

The fluid management module according to the invention serves for cooling an electric energy store by means of immersion cooling. The electric energy store can comprise multiple battery cell modules which are arranged in a housing through which one or more cooling paths are led, which fluidically communicate with the fluid path of the fluid management module, so that cooling medium can flow out of the fluid management module through the cooling paths. Here, the individual battery cell modules of the electric energy store, as provided with the immersion cooling, are directly flowed about by the cooling medium.

The module includes a fluid path through which a cooling medium can flow, which comprises an inlet connection and an outlet connection for fluidically connecting the fluid path with the energy store to be cooled. Thus, the cooling medium in the fluid management module can flow through the fluid path from the inlet connection to the outlet connection. Further, the module includes a heat exchanger arranged in the fluid path for discharging heat from the cooling medium. For this purpose, a further fluid, fluidically disconnected from the cooling medium but thermally connected with the same, can be conducted through the heat exchanger. In this way, the cooling medium can again pass on the waste heat absorbed from the electric energy store.

According to the invention, a valve device of the module is arranged in the fluid path between the inlet connection and the outlet connection. The valve device is designed in such a manner that it permits a flow of the cooling medium through the fluid path along a first flow direction from the inlet connection to the outlet connection and prevents a flow along a second flow direction—opposite to the first flow direction—from the outlet connection to the inlet connection.

Between the valve device and the outlet connection, a service inlet connection of the module communicating with the fluid path and a service outlet connection of the module communicating with the fluid path between the inlet connection and the heat exchanger are present each for fluidically connecting the fluid path with the service unit explained above. The service unit includes a cooling medium reservoir with cooling medium which, via the service inlet connection, can be supplied to the fluid management module when the same is to be filled with cooling medium. When the fluid management module is to be flushed, the cooling medium, via the service inlet connection and the service outlet connection, can be circulated between the service unit and the fluid management module as well as the energy store connected to the module.

By means of the valve device according to the invention it is thus ensured that during the flushing the entire cooling medium introduced into the module from the service unit also flows through the energy store and cannot flow past the electric energy store in the manner of an undesirable bypass through the heat exchanger and the filter device, so that the said energy store can only be subjected to the desired flushing to a weakened extent.

According to a preferred embodiment, the valve device is arranged in the fluid path between the heat exchanger and the filter device. Thus, in particular the heat exchanger is protected from being undesirably flowed through in the second flow direction.

Particularly practically, the heat exchanger is arranged in the fluid path between the filter device and the inlet connection and the filter device between the heat exchanger and the outlet connection. In this way, the cooling medium when flowing through the fluid path can be initially cooled and subsequently cleaned.

According to an advantageous further development, the valve device includes a valve opening arranged in the fluid path that can be flowed through by the cooling medium and an adjustable valve body, which can preferably be formed as valve flap, particularly preferably as pivotable valve flap. The valve body is adjustable between a closed position, in which the valve body closes the valve opening in a fluid-tight manner and an open position, in which the valve body opens the valve opening for being flowed through by the cooling medium. In this embodiment, the valve device is designed and matched to the module so that the valve body when the fluid path is flowed through by cooling medium is adjusted along the first flow direction into the open position and when the fluid path is flowed through by cooling medium, is adjusted into the closed position along the second flow direction. In this way it is achieved without active control that the cooling medium can only flow along the first flow direction through the valve opening and thus also through the fluid path but not along the second flow direction.

In a variant alternative to this, the valve device can include or be a non-return valve with which with respect to the flow through the fluid path only along the first flow direction but not along the second flow direction, the same result can be achieved as with the flap valve explained above.

Preferentially, the service inlet connection is arranged in the fluid path between the filter device and the outlet connection. Particularly preferably, the service inlet connection is arranged in the filter device, in particular in a clean side of the filter device. Practically, the filter device can be arranged in the fluid path downstream of the heat exchanger.

According to a further preferred embodiment, the fluid path extends along the first flow direction from the inlet connection to the outlet connection. In this embodiment, the service outlet connection is arranged in the fluid path downstream of the inlet connection. Apart from this, the service inlet connection is arranged in the fluid path downstream of the service outlet connection and upstream of the outlet connection.

Particularly practically, the heat exchanger and the filter device can be arranged in the fluid path between the service inlet connection and the service outlet connection. In this way, it can be ensured with the help of the valve device that is substantial for the invention that during the flushing operation the filter device and the heat exchanger are not flushed as well, but that the cooling medium is exclusively conducted through the energy store.

Further, the invention relates to a method for operating a fluid management module according to the invention introduced above so that the advantages of the module according to the invention explained above also apply to the method according to the invention. The method according to the invention includes three measures a), b) and c).

In measure a), both the fluid management module and also an electric energy store fluidically connected for cooling to the inlet connection and the outlet connection are provided.

In a measure b) carried out after measure a), a service unit, which includes a cooling medium reservoir with a cooling medium, is connected to the service inlet connection. In measure c), the fluid path and the electric energy store connected to the fluid path are filled with cooling medium from the cooling medium reservoir.

According to a preferred embodiment, the method includes two additional measures d) and e). According to measure d), the service unit is connected to the service outlet connection of the module. In a measure e) carried out after measure d), the cooling medium is circulated through the fluid path of the fluid management module, through the service unit and through the energy store along the first flow direction in order to flush the electric energy store in this manner.

Further, the invention relates to an arrangement which is equipped for carrying out the method according to the invention introduced above. The arrangement according to the invention includes a fluid management module according to the invention introduced above, so that the advantages of the fluid management module according to the invention explained above also apply to the arrangement according to the invention. Further, the arrangement includes an electric energy store which is designed so as to be flowed about by the cooling medium, so that the cooling medium, when flowing about the energy store, can absorb waste heat generated by the same. Here, the energy store fluidically communicates both with the inlet connection and also with the outlet connection of the module, so that cooling medium from the fluid path of the module, can be conducted through the energy store and in particular circulated.

According to a preferred embodiment of the arrangement according to the invention, the same includes a service unit which contains a cooling reservoir for or with cooling medium. The service unit is connected at least to the service inlet connection, preferentially to the service inlet connection and to the service outlet connection of the fluid management module, so that the fluid path and the energy store can be supplied with cooling medium from the service unit.

Further important features and advantages of the invention are obtained from the subclaims, from the drawings and from the associated figure description by way of the drawings.

It is to be understood that the features mentioned above and still to be explained in the following cannot only be used in the respective combination stated but also in other combinations or by themselves without leaving the scope of the present invention.

Preferred exemplary embodiments of the invention are shown in the drawings and are explained in more detail in the following description, wherein same reference numbers relate to same or similar or functionally same components.

BRIEF DESCRIPTION OF THE DRAWINGS

It shows, in each case schematically.

DETAILED DESCRIPTION

Figure 1:
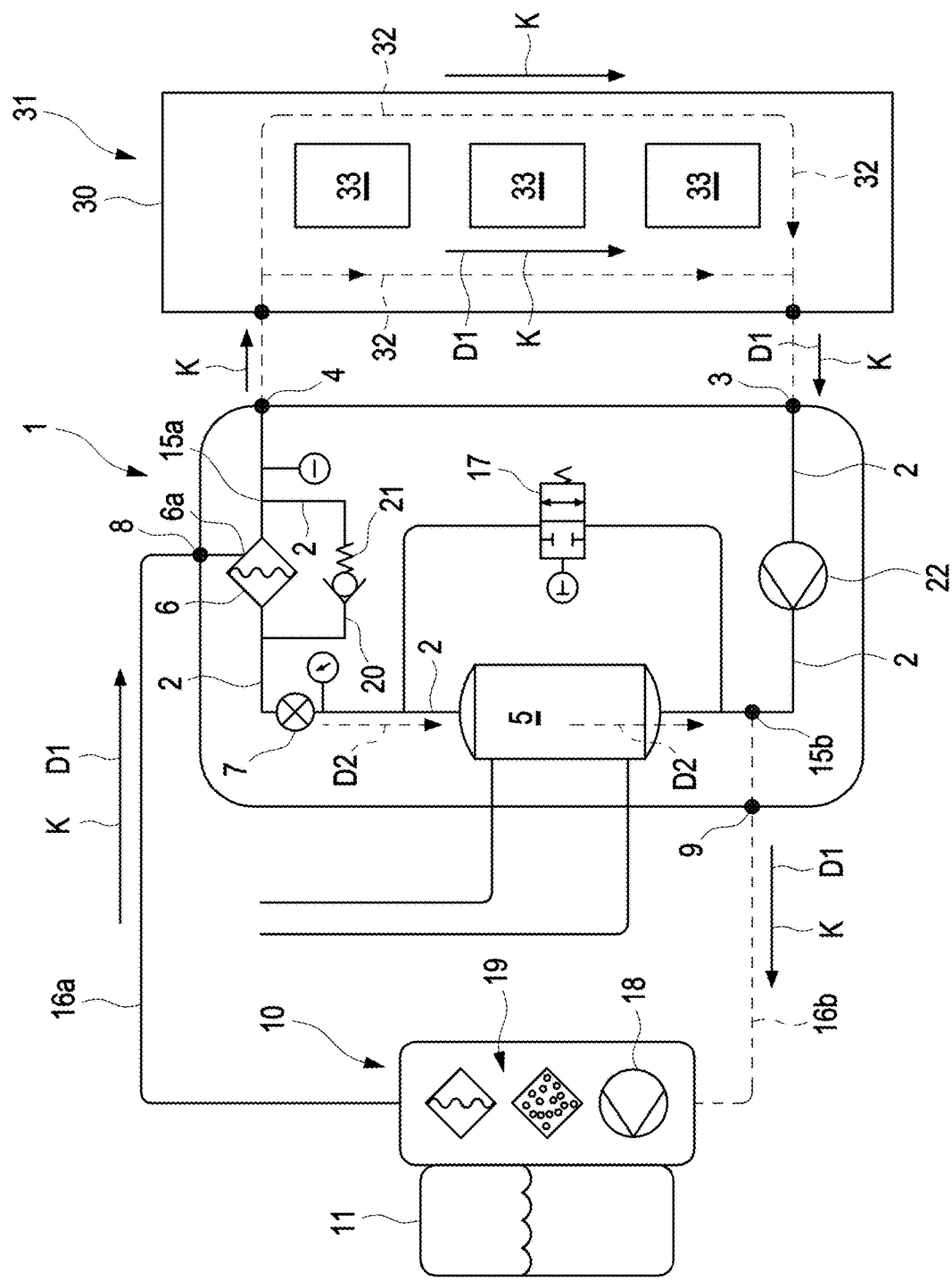
FIG. 1 an example of an arrangement according to the invention having a fluid management module according to the invention, FIG. 2a an example of a valve device formed as flap valve situated in a closed position in a perspective representation, FIG. 2b the valve device of FIG. 2 in its open position, FIG. 3 a variant of the example of FIG. 1, in which the second branch point is arranged between the heat exchanger and the filter device, FIGS. 4a and 4b the valve device of the arrangement according to FIG. 3 in its closed position according to FIG. 4a and its open position according to FIG. 4b.

FIG. 1 illustrates an example of an arrangement 25 according to the invention having a fluid management module 1 according to the invention for cooling an electric energy store 31 by means of immersion cooling.

The module 1 includes a fluid path 2 that can be flowed through by a cooling medium K, which comprises an inlet connection 3 and an outlet connection 4 for fluidically connecting the fluid path 2 with the energy store 31 to be cooled. The electric energy store 31 in FIG. 1 is only shown rough schematically and can comprise a housing 30 through which one or more cooling paths 32 are led, which fluidically communicate with the fluid paths 2 of the fluid management module 1 and through which the cooling medium K can thus be conducted out of the fluid path 2 of the fluid management module 1. Because of this, battery cell modules 33 of the energy store 31 arranged in the housing 30 are directly flowed about by the cooling medium K. The cooling path 32 can also include at least one cooling channel via which the cooling medium K is conducted to or about the battery cell modules 33.

The fluid path 2 extends along a first flow direction D1 from the inlet connection 3 to the outlet connection 4. The module 1, further, includes a heat exchanger 5 arranged in the fluid path 2 for discharging heat from the cooling medium K and a filter device 6 likewise arranged in the fluid path 2 for cleaning the cooling medium K. With respect to the flow direction D1, the filter device 6 is arranged in the fluid path 2 downstream of the heat exchanger 5. The heat exchanger 5 is arranged between the filter device 6 and the inlet connection 3. The filter device 6 is arranged in the fluid path 2 between the heat exchanger 5 and the outlet connection 4.

Fluidically parallel to the heat exchanger 5, a thermostat 17 can be provided. Apart from this, the fluid management module 1 can comprise a bypass 20 having a bypass valve 21, via which the fluid path 2 can be routed past the filter device 6. Apart from this, a delivery device 22 for driving the cooling medium K can be arranged in the fluid path 2.

Furthermore, a valve device 7 is provided in the fluid path 2 between the inlet connection 3 and the outlet connection. This valve device 7 is designed and arranged in the fluid path 2 in such a manner that it permits cooling medium K to flow through the fluid path 2 along the first flow direction D1 from the inlet connection 3 to the outlet connection 4 and prevents the same in a second flow direction D2 from the outlet connection 4 to the inlet connection 3, i.e. opposite to the first flow direction D1. In the example, the valve device 7 is arranged in the fluid path 2 between the heat exchanger 5 and the filter device 6.

Further, the module includes a service inlet connection 8 communicating with the fluid path 2 between the valve device 7 and the outlet connection 4 and a service outlet connection 9 communicating with the fluid path 2 between the inlet connection 3 and the heat exchanger 5. For this purpose, the service inlet connection 8 and the service outlet connection 9 branch off from the fluid path 2 in a first and second branch point 15a, 15b respectively. The service inlet connection 8 and the service outlet connection 9 serves for fluidically connecting the fluid path 2 with a service unit 10 of the arrangement 25, which in turn includes a cooling medium reservoir 11 with a supply of cooling medium K.

Thus, the fluid management module 1 and also the energy store 31 connected to the module 1 can be both filled with cooling medium K from the service unit 10 and also flushed with cooling medium K from the service unit 10, which will still be explained in more detail in the following.

In a nominal operation of the fluid management module 1, in which the service unit 10 is not connected to the module 1, the service inlet connection 8 and the service outlet connection 9 are closed so that no cooling medium K can escape via these two connections 8, 9 from the fluid path 2 into the external surroundings of the fluid management module 1.

When the module 1 is to be filled with cooling medium K from the service unit 10, the service unit 10 can be fluidically connected with the service inlet connection 8 of the module 1 via the first supply line 16a. In the process, the service outlet connection 9 can remained closed.

In this way, the fluid path 2 and the energy store 31 are supplied with cooling medium K from the service unit 10 via the service inlet connection 8. Because of this, the energy store 31 connected to the module 1 is filled with cooling medium K. Here, the fluid path 2 is flowed through with cooling medium K from the cooling medium reservoir 11 of the service unit 10 along the first flow direction D1. In the process, the valve device 7 prevents a flow along the second flow direction D2 opposite to the first flow direction D1.

When the energy store 31 is to be flushed not only with cooling medium K, the previously closed service outlet connection 9 can be connected for this purpose via the second supply line 16b (shown in dashed line in FIG. 1) with the service unit 10 and thus with the cooling reservoir 11. In this way, the fluid circuit formed by the fluid path 2 and the cooling paths 32 in the fluid management module 1 and in the electric energy store 31 during the nominal operation is expanded by the service unit 10 so that through circulation of the cooling medium K through the fluid management module 1, the energy store 31 and the service unit 10, the desired flushing with cooling medium K takes place.

Figure 2:
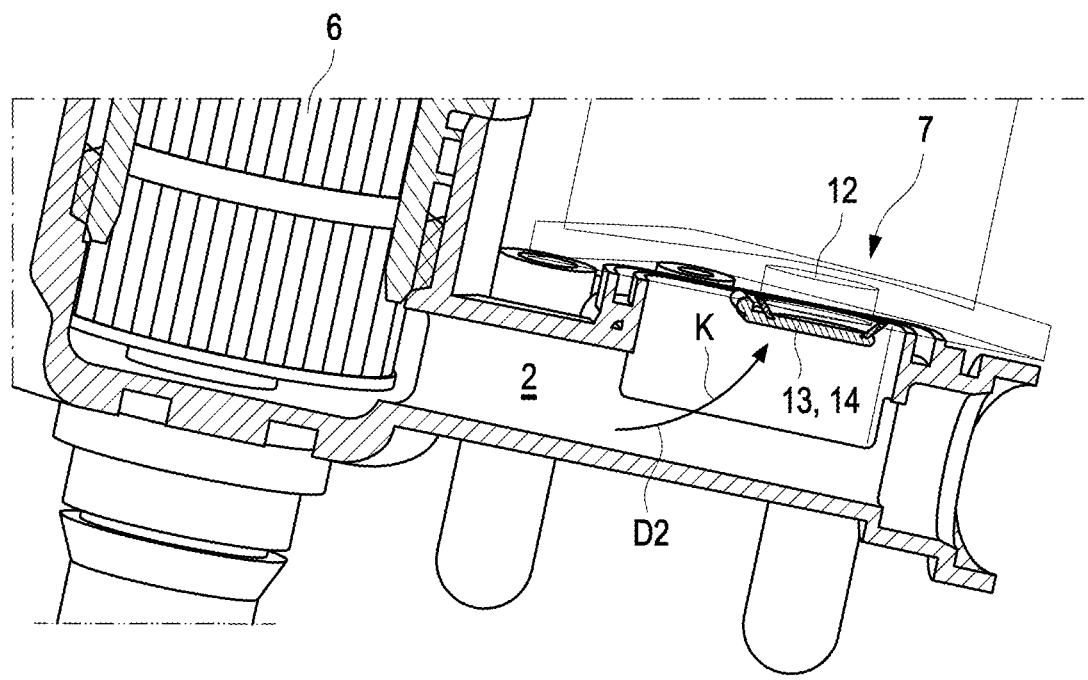
Figure 2:
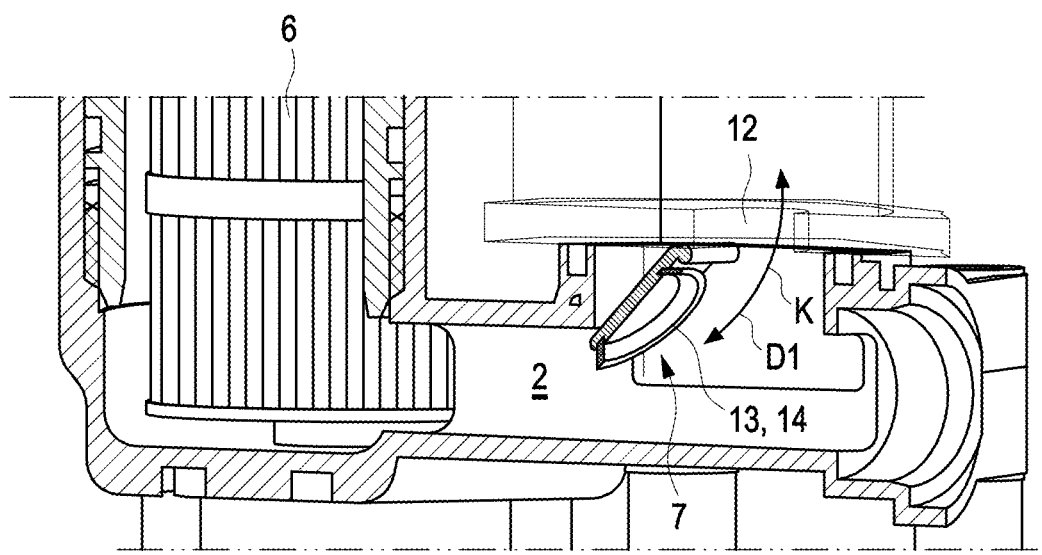

The FIGS. 2a and 2b show the fluid management module 1 in the region of the valve device 7 each in perspective representation. Accordingly, the valve device 7 includes a valve opening 12 arranged in the fluid path 2 that can be flowed through by the cooling medium K and an adjustable valve body 13, for example in the form of an adjustable valve flap 14. The valve body 13 is adjustable between a closed position, in which it closes the valve opening 12 in a fluid type manner, and an open position, in which it opens the valve opening 12 for being flowed through by the cooling medium K.

FIG. 2a shows the valve body 13 and the valve flap 14 in the closed position. FIG. 2b shows the valve body 13 and the valve flap 14 in the open position. The valve device 12 is designed and matched to the fluid management module 1 in such a manner that the valve body 13, when the fluid path 2 is flowed through by cooling medium K along the first flow direction D1, is adjusted into the open position and when the fluid path 2 is flowed through by cooling medium K along the second flow direction D2, i.e. opposite to the first flow direction D1, is adjusted into the closed position. Thus it is ensured that during the flushing the entire cooling medium introduced from the service unit 10 into the module 1 also flows through the energy store 31 and cannot flow through the heat exchanger 5 and the filter device 6 in the flow direction D2—as indicated in FIG. 1 by means of a dashed arrow—past the energy store 31.

In a variant not shown in the figures, the valve device 7 can be formed as a non-return valve or include such a non-return valve.

In addition to the cooling medium reservoir 11, the service unit 10 can also include a service delivery device 18 for driving and circulating the cooling medium K through the fluid management module 1, through the energy store 31 and through the service unit 10. Likewise, a service filter device 19 can be provided in the service unit 10, which during the flushing operation is flowed through by the cooling medium K so that the same can be cleaned of dirt particles and the like.

In the following, the method according to the invention, during which the module 1 and the energy store 31 are initially filled with cooling medium K and subsequently flushed by circulation of the cooling medium K, is explained by way of FIG. 1.

Accordingly, the fluid management module 1 in a first measure a) of the method is provided to the arrangement 25 and with the inlet connection 3 and the outlet connection 4 connected to the energy store 31.

Having carried out measure a), the service unit 10 with a cooling medium reservoir 11 is connected to the service inlet connection 8 in a second measure b). In this state, the service outlet connection 9 need not be mandatorily connected fluidically with the service unit 10. In particular, the service outlet connection 9 can be closed in a fluid-type manner by means of a suitable closure. Nevertheless, the fluid path 2 and the energy store 31 can be filled according to a third measure c) with cooling medium K from the cooling medium reservoir 11, since the fluid path 2 communicates via the service inlet connection 8 with the service unit 10 and the energy store 31 fluidically communicates with the fluid path 2 via the inlet connection 3 and the outlet connection 4.

The flushing of the energy store 31 with the cooling medium K takes place in two further measures d) and e) of the method. In measure d), the service unit 10 is connected to the service outlet connection 9 of the module 1. By way of this, the cooling medium K in a further measure e) is circulated through the fluid path 2 of the fluid management module 1, through the service unit 10 and through the energy store 31 along the first flow direction D1, and the desired flushing of the energy store 31 is achieved in this way.

Figure 3:
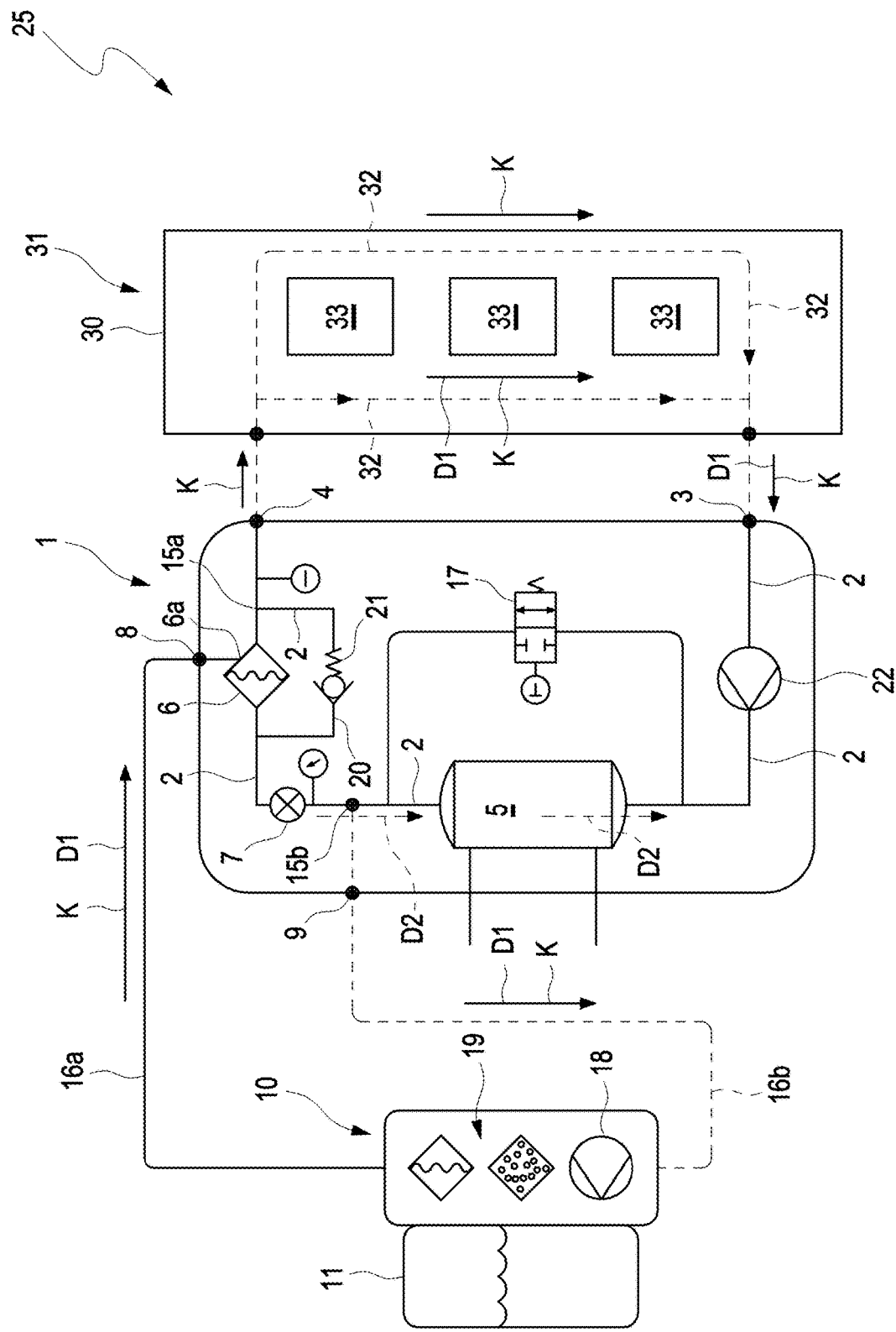

FIG. 3 shows a variant of the example of FIG. 1. The example of FIG. 3 differs from the example of FIG. 1 in that here the second branch point 15b and thus the service outlet connection 9 are arranged between the heat exchanger 5 and the filter device 6. Thus, in the example of FIG. 3, only the filter device 6 but not the heat exchanger 5 are arranged in the fluid path 2 between the service inlet connection 8 and the service outlet connection 9, whereas in the example of FIG. 1 the heat exchanger 5 and the filter device 6 are arranged in the fluid path 2 between the service inlet connection 8 and the service outlet connection. Because of this, the heat exchanger 5 in the variant according to FIG. 3 is also flushed and cleaned during the circulation of the cooling medium K according to measure e).

A combination of the examples of FIGS. 1 and 3 is also conceivable. In this case, two second branch points 15b are provided, wherein one of these two branch points 15b according to FIG. 1 is arranged in the fluid path 2 and the other one of these two branch points 15b according to FIG. 3 is arranged in the fluid path 2. Thus, in a first circulation phase in measure e), the service unit 10 can be connected to the second branch point 15b according to FIG. 1. Although during the circulation of the cooling medium K the heat exchanger 5 is not cleaned as well in the first circulation phase; but it is thus also prevented that dirt, which is absorbed by the cooling medium K in the fluid path 2 upstream of the heat exchanger 5, can enter the heat exchanger 5 and cause contaminations there. In a second circulation phase following the first circulation phase the service unit 10 is then disconnected from the second branch point 15b according to FIG. 1 and instead connected to the second branch point 15b according to FIG. 3. Following this, the heat exchanger 5 is cleaned as well during the circulation of the cooling medium K.

Figure 4:
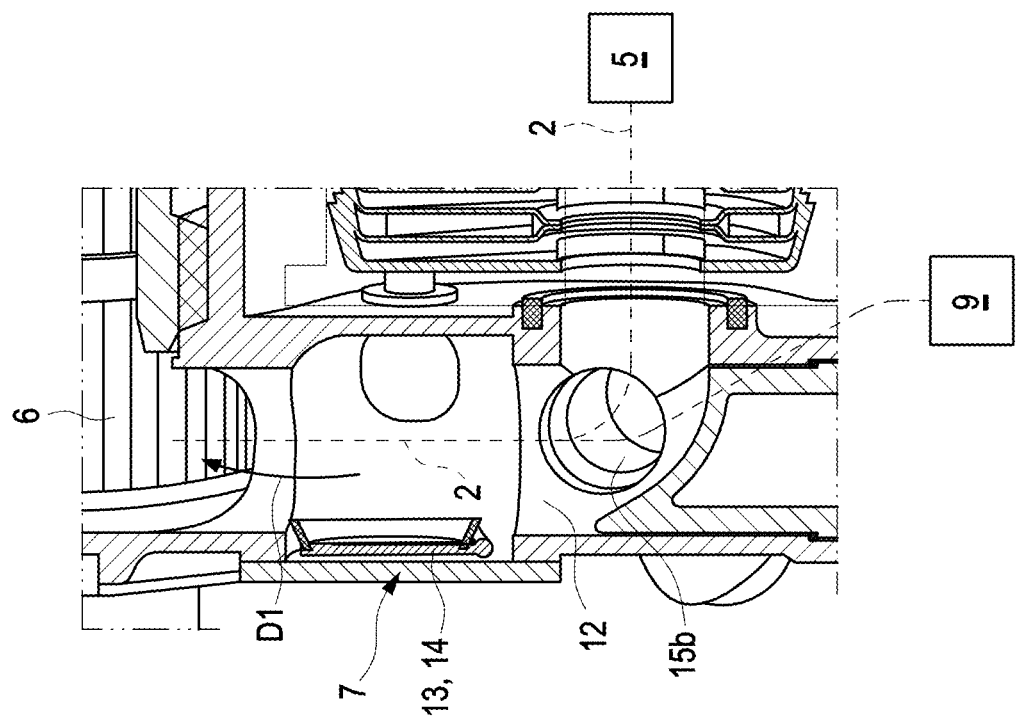
Figure 4:
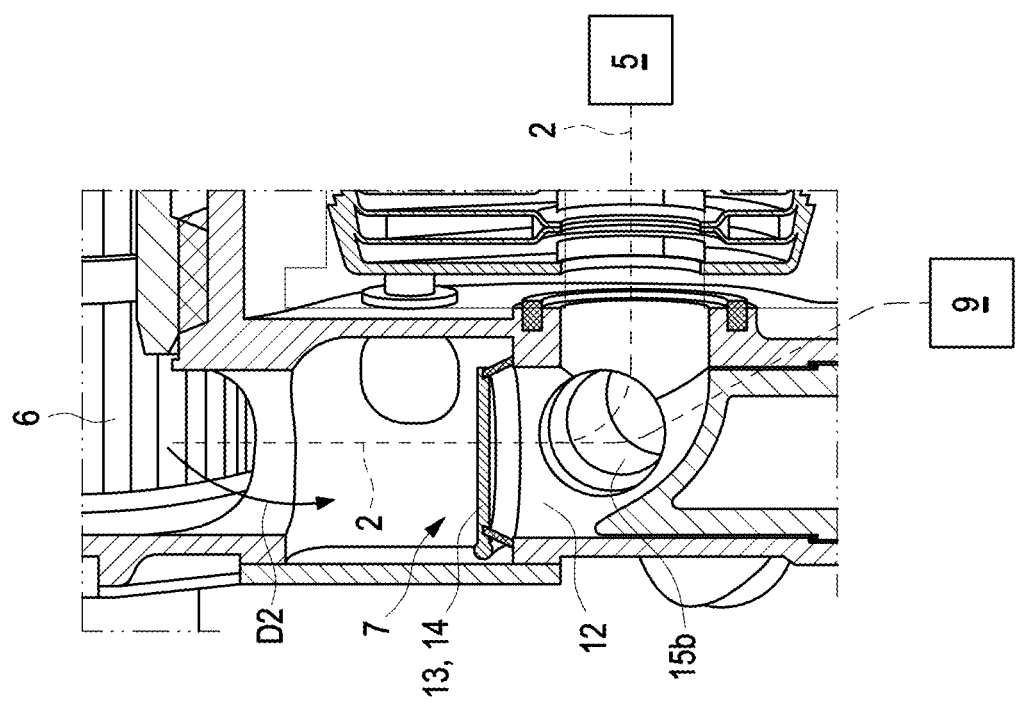

The FIGS. 4a and 4b show the fluid management module 1 analogously to the FIGS. 2a and 2b according to the variant of FIG. 3 in the region of the valve device 7 each in perspective representation. The course of the fluid path 2 is indicated by a dashed line. The position of the second branch point 15b is likewise drawn in. The position of the heat exchanger 5 just like the fluid conduction to the service outlet connection 9 is only indicated schematically.

FIG. 4a shows the valve body 13 and the valve flap 14 in the closed position. FIG. 4b shows the valve body 13 and the valve flap 14 in the open position. The valve device 12 is designed and matched to the fluid management module 1 so that the valve body 13, when the fluid path 2 is flowed through by cooling medium K along the first flow direction D1, is adjusted into the open position (see FIG. 4b) and when the fluid path 2 is flowed through by cooling medium K along the second flow direction D2, i.e. opposite to the first flow direction D1, is adjusted into the closed position (see FIG. 4a). Thus, it is ensured that during the flushing the entire cooling medium introduced from the service unit 10 into the module 1 also flows through the energy store 31 and cannot flow past in the flow direction D2—as indicated in FIG. 1 by means of a dashed arrow—through the heat exchanger 5 and the filter device 6 past the energy store 31.

The invention claimed is:

1. A fluid management module for cooling an electric energy store by immersion cooling, comprising:
   a fluid path that can be flowed through by a cooling medium, the fluid path comprises an inlet connection and an outlet connection for fluidically connecting the fluid path with the energy store to be cooled,
   a heat exchanger arranged in the fluid path for discharging heat from the cooling medium and a filter device arranged in the fluid path for cleaning the cooling medium,
   a valve device arranged in the fluid path between the inlet connection and the outlet connection, the valve device structured and arranged to permit the cooling medium to flow through the fluid path along a first flow direction from the inlet connection to the outlet connection and prevent the cooling medium from flowing along a second flow direction from the outlet connection to the inlet connection,
   a service inlet connection communicating with the fluid path between the valve device and the outlet connection and a service outlet connection communicating with the fluid path between the inlet connection and the heat exchanger for fluidically connecting the fluid path with a service unit comprising a cooling medium reservoir for the cooling medium.

2. The module according to claim 1, wherein the valve device is arranged in the fluid path between the heat exchanger and the filter device.

3. The module according to claim 1, wherein the heat exchanger is arranged in the fluid path between the filter device and the inlet connection, and the filter device is arranged between the heat exchanger and the outlet connection.

4. The module according to claim 1, wherein:
the valve device includes a valve opening that is arranged in the fluid path and can be flowed through by the cooling medium and an adjustable valve body that is adjustable between a closed position where the valve body closes the valve opening in a fluid-tight manner, and an open position where the valve body opens the valve opening for being flowed through by the cooling medium, and
the valve device is structured and arranged so that the valve body, when the fluid path is flowed through by cooling medium along the first flow direction, is adjusted into the open position and when the fluid path is flowed through by cooling medium along the second flow direction, is adjusted into the closed position.

5. The module according to claim 1, wherein the valve device includes a non-return valve.

6. The module according to claim 1, wherein the service inlet connection is arranged in the fluid path between the filter device and the outlet connection.

7. The module according to claim 1, wherein the service inlet connection is arranged in the filter device.

8. The module according to claim 1, wherein:
the fluid path extends along the first flow direction from the inlet connection to the outlet connection,
the service outlet connection is arranged in the fluid path downstream of the inlet connection, and
the service inlet connection is arranged in the fluid path downstream of the service outlet connection and upstream of the outlet connection.

9. The module according to claim 1, wherein:
the heat exchanger and the filter device are arranged in the fluid path between the service inlet connection and the service outlet connection, or
only the filter device, but not the heat exchanger, is arranged in the fluid path between the service inlet connection and the service outlet connection.

10. The module according to claim 1, wherein the filter device is arranged in the fluid path downstream of the heat exchanger.

11. A method for operating a fluid management module, comprising the following steps:
a) providing the fluid management module and an electric energy store connected to an inlet connection and to an outlet connection to be cooled, the fluid management module including a fluid path with the inlet connection and the outlet connection, a heat exchanger and a filter device arranged in the fluid path, a valve device arranged in the fluid path that permits a cooling medium to flow along a first flow direction from the inlet connection to the outlet connection and blocks the cooling medium from flowing along a second flow direction from the outlet connection to the inlet connection, and a service inlet connection communicating with the fluid path between the valve device and the outlet connection and a service outlet connection communicating with the fluid path between the inlet connection and the heat exchanger,
b) connecting a service unit having a cooling medium reservoir containing the cooling medium to the service inlet connection, and
c) filling the fluid path and the electric energy store connected to the fluid path with cooling medium from the cooling medium reservoir.

12. The method according to claim 11, further comprising the following additional steps d) and e):
d) connecting the service unit to the service outlet connection, and
e) circulating the cooling medium through the fluid path, through the service unit and through the electric energy store along the first flow direction.

13. An arrangement, comprising:
a fluid management module, the fluid management module including:
a fluid path flowable through by a cooling medium, the fluid path comprising an inlet connection and an outlet connection;
a heat exchanger arranged in the fluid path for discharging heat from the cooling medium and a filter device arranged in the fluid path for cleaning the cooling medium;
a valve device arranged in the fluid path between the inlet connection and the outlet connection, the valve device structured and arranged to permit the cooling medium to flow through the fluid path along a first flow direction from the inlet connection to the outlet connection and block the cooling medium from flowing along a second flow direction from the outlet connection to the inlet connection;
a service inlet connection communicating with the fluid path between the valve device and the outlet connection and a service outlet connection communicating with the fluid path between the inlet connection and the heat exchanger;
an electric energy store structured so that it can be flowed about by the cooling medium, wherein the energy store fluidically communicates with the inlet connection and the outlet connection, so that cooling medium from the fluid path can be conducted through the energy store to cool the energy store.

14. The arrangement according to claim 13, further comprising a service unit that contains a cooling medium reservoir for the cooling medium,
wherein the service unit is connected at least to the service inlet connection so that the fluid path and the electric energy store can be supplied with the cooling medium from the service unit.

15. The arrangement according to claim 13, wherein the valve device is arranged in the fluid path between the heat exchanger and the filter device.

16. The arrangement according to claim 15, wherein the heat exchanger is arranged in the fluid path between the filter device and the inlet connection, and the filter device is arranged between the heat exchanger and the outlet connection.

17. The arrangement according to claim 13, wherein the valve device comprises a non-return valve.

18. The arrangement according to claim 13, wherein the service inlet connection is arranged in the fluid path between the filter device and the outlet connection.

19. The arrangement according to claim 13, wherein the service inlet connection is arranged in a clean side of the filter device.

20. The arrangement according to claim 19, wherein the filter device is arranged in the fluid path downstream of the heat exchanger.

* * * * *